(12) United States Patent
Huang et al.

(10) Patent No.: US 7,051,887 B2
(45) Date of Patent: May 30, 2006

(54) SUPPORTING COLUMN AND CASSETTE USING THE SAME

(75) Inventors: Chun Kai Huang, Shinjuang (TW); Ming-Hui Chang, Miaolih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 127 days.

(21) Appl. No.: 10/643,559

(22) Filed: Aug. 18, 2003

(65) Prior Publication Data

US 2004/0069732 A1    Apr. 15, 2004

(30) Foreign Application Priority Data

Oct. 9, 2002    (TW)    ............................. 91216034 U

(51) Int. Cl.
*A47F 7/00*    (2006.01)
(52) U.S. Cl. .................... 211/183; 211/41.18; 211/40
(58) Field of Classification Search ................ 211/40, 211/41.18, 183; 118/500; 414/935; 206/710, 206/711, 454, 832
See application file for complete search history.

(56) References Cited

U.S. PATENT DOCUMENTS

| | | | | |
|---|---|---|---|---|
| 4,153,164 A | * | 5/1979 | Hofmeister et al. | ..... 211/41.18 |
| 4,515,104 A | * | 5/1985 | Lee | ............................. 118/500 |
| 4,676,008 A | * | 6/1987 | Armstrong | .................... 34/237 |
| 4,872,554 A | * | 10/1989 | Quernemoen | ................ 206/454 |
| 5,452,795 A | * | 9/1995 | Gallagher et al. | ........... 206/711 |
| 5,534,074 A | * | 7/1996 | Koons | ......................... 118/728 |
| 5,584,401 A | | 12/1996 | Yoshida | |
| 5,853,214 A | * | 12/1998 | Babbs et al. | ................. 294/161 |
| 6,092,981 A | * | 7/2000 | Pfeiffer et al. | .............. 414/810 |
| 6,126,020 A | * | 10/2000 | Mok | ............................ 211/40 |
| 6,237,979 B1 | * | 5/2001 | Korn et al. | .................. 294/159 |
| 6,341,935 B1 | * | 1/2002 | Tseng | ......................... 414/800 |
| 6,523,701 B1 | * | 2/2003 | Yoshida et al. | ........... 211/41.18 |
| 6,532,642 B1 | * | 3/2003 | Wingo | ......................... 29/558 |
| 6,776,289 B1 | * | 8/2004 | Nyseth | ........................ 206/711 |
| 2003/0010672 A1 | * | 1/2003 | Simpson et al. | ............. 206/711 |
| 2004/0200788 A1 | * | 10/2004 | Shon et al. | ............... 211/41.18 |

FOREIGN PATENT DOCUMENTS

JP    H04-139741    5/1992

* cited by examiner

*Primary Examiner*—Jennifer E. Novosad
(74) *Attorney, Agent, or Firm*—Wei Te Chung

(57) ABSTRACT

A supporting column (30) of the present invention includes a main body (31) and a stiff shaft (33). The main body (31) includes a half-sleeve shaft (319) and a plurality of parallel wing panels (317) encircling portions of the half-sleeve shaft. The main body has a C-shaped cross section and defines an axial bore along an axis direction. The wing panels are formed perpendicular to the half-sleeve shaft and each wing panel provides a protrusion (318) in the middle of the wing panel. A cassette (40) incorporating the supporting columns is used to accommodate a plurality of substrates.

10 Claims, 5 Drawing Sheets

SUPPORTING COLUMN AND CASSETTE USING THE SAME

BACKGROUND OF THE INVENTION

1. Field of the Invention

The present invention relates to a supporting column and a cassette using the same, and more particularly to a supporting column for use in transporting substrates.

2. Description of the Related Art

In handing substrates, such as glass substrates for LCDs, cassettes are useful for holding or stowing the substrates to keep them from contacting, and thus damaging each other. In general, cassettes comprise a box-shaped resin frame equipped with pairs of supporting columns, each column having a plurality of slots. The slots are so arranged such that a group of slots in a same horizontal plane cooperate with each other to stow one substrate. Thus, a plurality of substrates can be safely stacked within a cassette, one above the other.

A supporting column 10 of a conventional cassette described in JP Yodogawa Kasei publication number H04-139741 and shown in FIG. 6, comprises a resin-made rod 11 and a metal rod 13. The metal rod 13 is located in a through hole 115 defined in the center of the resin-made rod 11. Moreover, the resin-made rod 11 is provide with a plurality of annular slots 111 defined in the resin-made rod 11, and defines a fixing slot 113 and a threaded hole 131 in each of two opposite ends.

A plurality of the supporting columns 10 are fixed to a frame (not shown) to form a cassette (not shown) by means of the fixing slot 113 and a screw (not shown). But in use, only a small portion of the surface of each annular slot 111 actually touches the surface of a substrate. Furthermore the material making up the resin-made rod 11 must resist high temperatures and have high durability. Therefore, this circular-shape design of circle shape wastes material and is more expensive than necessary.

For the above reason, an improved supporting column with a low manufacturing cost is desired.

SUMMARY OF THE INVENTION

An object of the invention is to provide a low-cost supporting column.

Another object of the invention is to provide a cassette using the supporting columns.

In order to achieve the objects set forth above, a supporting column of the present invention comprises a main body and a stiff shaft. The main body comprises a half-sleeve shaft and a plurality of parallel wing panels encircling portions of the half-sleeve shaft. The half-sleeve shaft has a C-shaped cross section and defines an axial bore along an axial direction. The wing panels are formed perpendicular to the half-sleeve shaft and are spaced apart from one another a predetermined distance. Each wing panel provides a protrusion in the middle of the wing panel. A space interval is defined between neighboring wing panels. The stiff shaft has threaded holes defined in opposite ends thereof. In assembly, the stiff shaft is retainably received in the axial bore of the main body.

Since the supporting column of the present invention employs a half-sleeve shaft having a C-shaped cross section and a plurality of parallel wing panels, a significant savings in material used is achieved over the convention supporting column, which reduces manufacturing cost.

Other objects, advantages and novel features of the invention will become more apparent from the following detailed description of the preferred embodiment of the invention as illustrated in the accompanying drawings, in which:

BRIEF DESCRIPTION OF THE INVENTION

DETAILED DESCRIPTION OF THE INVENTION

Reference will be made to the drawings to describe the invention in detail.

Figure 1:
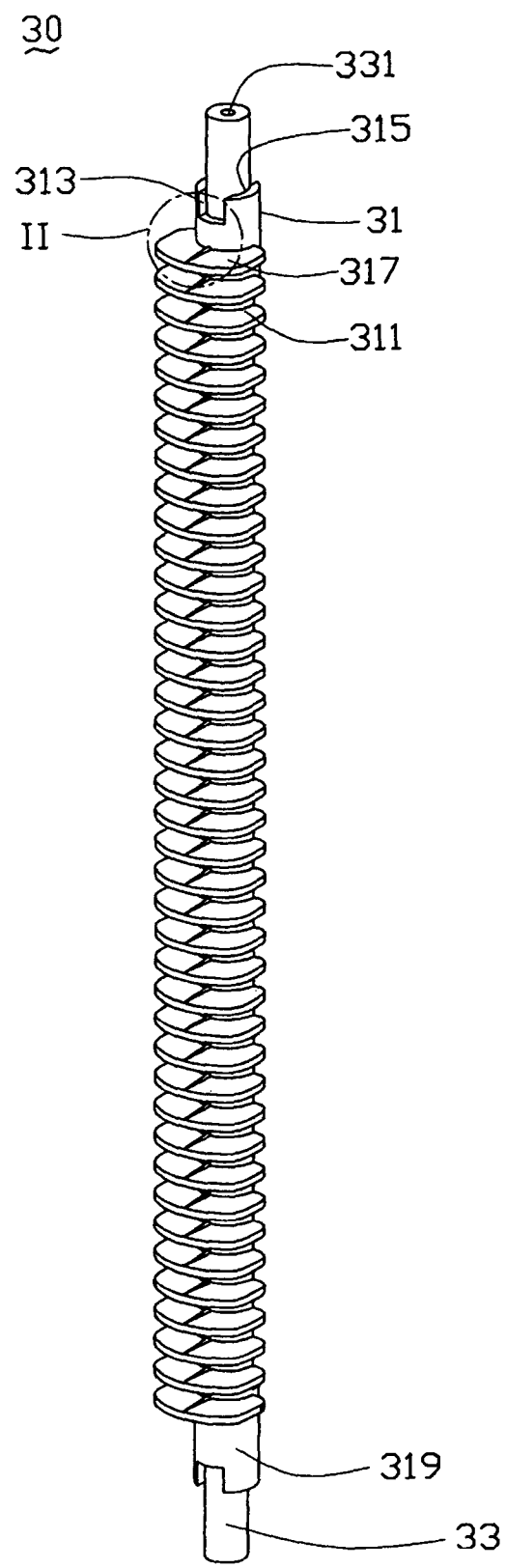
FIG. 1 is a perspective view of a supporting column according to the present invention.

Referring to FIG. 1, a supporting column 30 comprises a main body 31 and a stiff shaft 33. The main body 31 may be formed of resin, such as, by injection molding. The main body 31 comprises a half-sleeve shaft 319 with pairs of holding portions 318 (shown in FIG. 4) and a plurality of parallel wing panels 317 encircling portions of the half-sleeve shaft 319. The half-sleeve shaft 319 has a C-shaped cross section and defines an axial bore 315 along an axial direction. The shape of the wing panels 317 is round or approximately round, or tongue-shaped. The wing panels 317 are formed perpendicular to the half-sleeve shaft 319 and spaced apart from one another a predetermined distance. A space interval 311 is defined between neighboring wing panels. The stiff shaft 33 is made of metal. The stiff shaft 33 has threaded holes 331 defined in opposite ends thereof. In assembly, the stiff shaft 33 is retainably received in the axial bore 315 of the main body 31. The holding portions 338 extend along a circumference of the stiff shaft 33 beyond half circumference and space apart each other in the axis direction. Each pair of holding portions 338 can be connected as a ring for better holding function.

Figure 2:
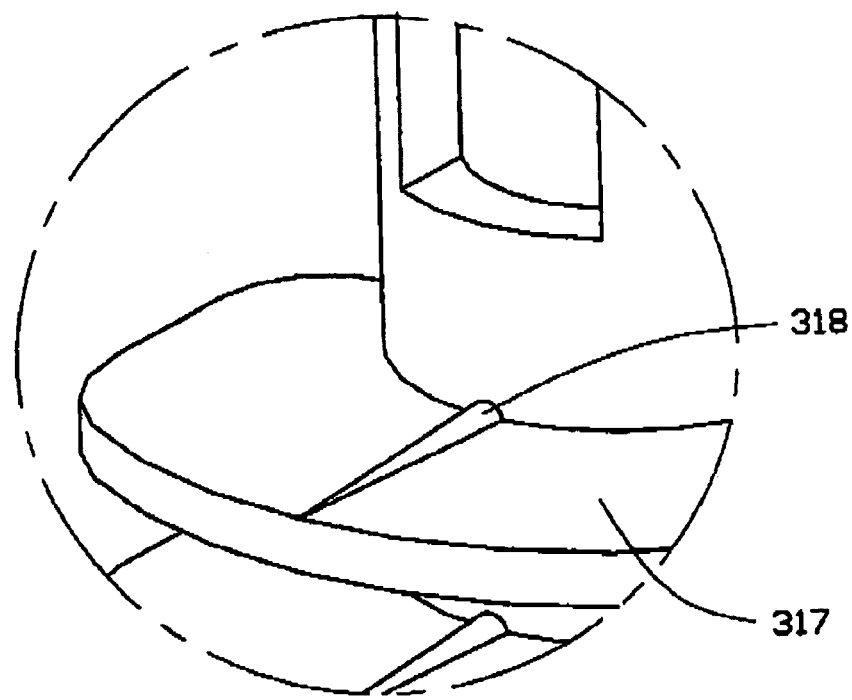
FIG. 2 is an enlarged view of a portion of the supporting column of FIG. 1.
Figure 3:
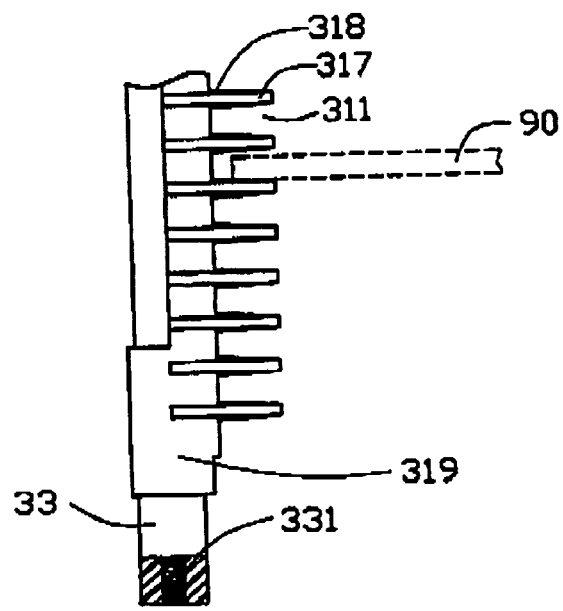
FIG. 3 is a side view of the supporting column of FIG. 1 mating with a substrate.

Referring to FIG. 2 and FIG. 3, each wing panel 317 has a protrusion 318 in the middle of the wing panel 317. A size of the protrusion 318 gradually decreases from the half-sleeve shaft 319 to an edge of the wing panel 317. The supporting surface (not labeled) of the protrusion 318 is shaped like a conicity or a hill.

Figure 4:
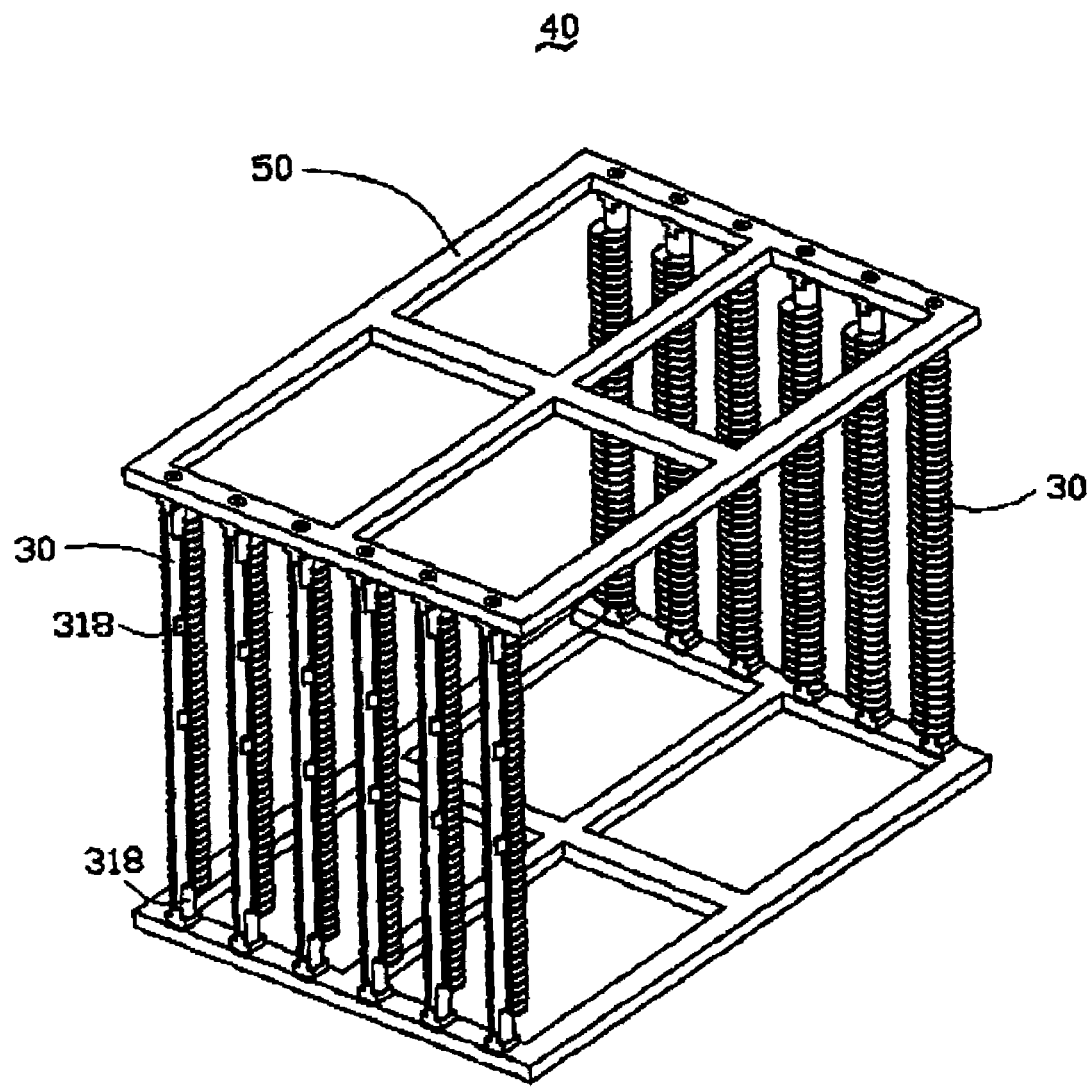
FIG. 4 is a perspective view of a cassette employing a plurality of supporting columns of FIG. 1 and a pair of frames.

Referring to FIG. 4, a cassette 40 for accommodating substrates 90 (see FIG. 3) includes a pair of frames 50 and a plurality of supporting columns 30. The frames 50 may be made of resin or metal. A plurality of threaded holes (see FIG. 5) is defined in opposite edges of the frames 50 for receiving screws therein. The wing panels 317 of the supporting columns 30 are arranged toward an interior of the cassette 40. The wing panels are located in a plurality of common planes and cooperate to form a plurality of supports for receiving a plurality of substrates 90.

Figure 5:
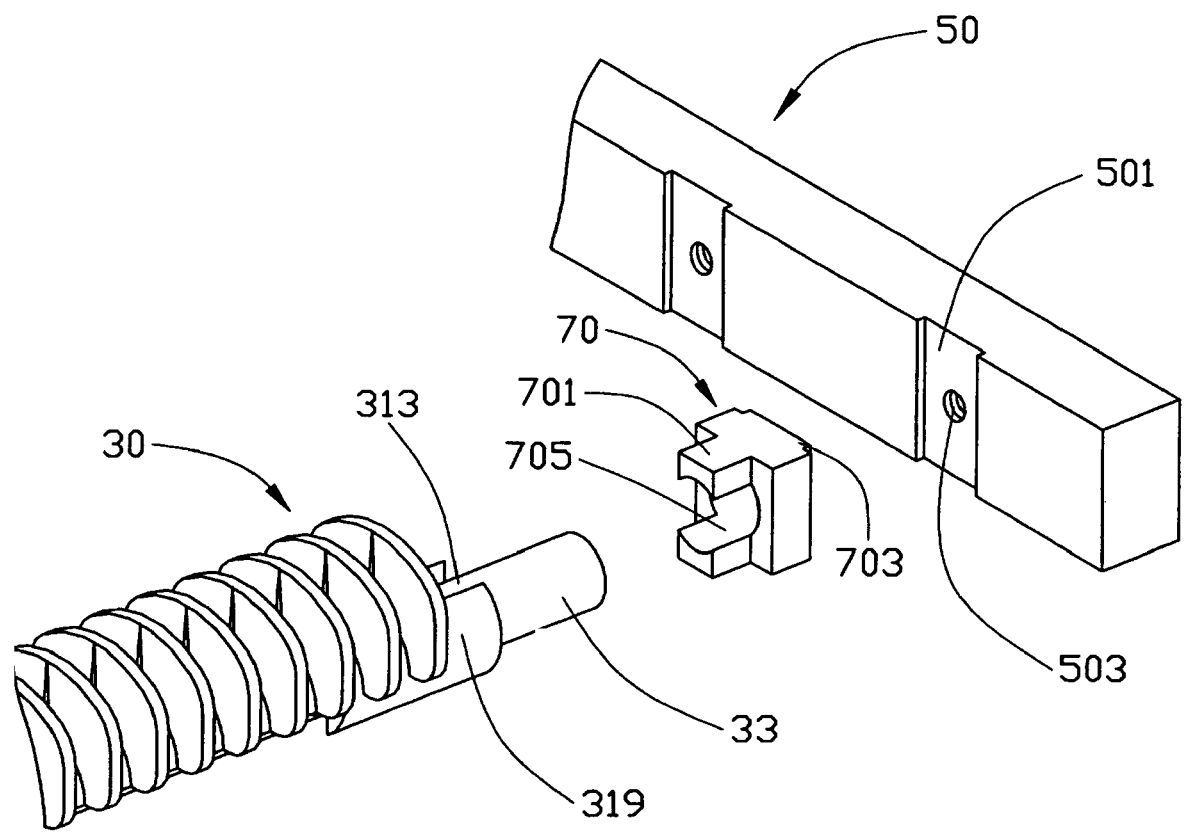
FIG. 5 is a partially exploded view of a partion of the cassette of FIG. 4 showing a portion of a supporting column, a stopper member and part of a frame.
Figure 6:
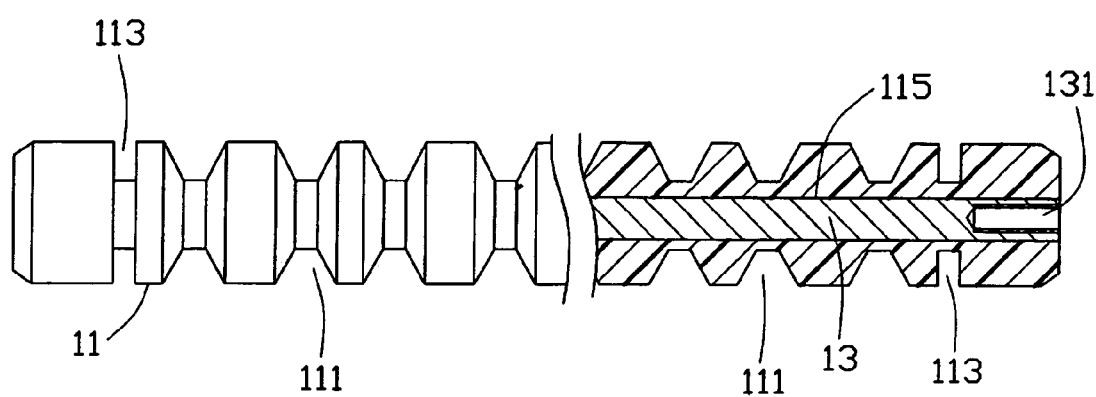
FIG. 6 is a partially sectioned, side view of a conventional supporting column.

Referring to FIG. 5, the supporting columns 30 are fixed to the frames 50 by means of pairs of stopper members 70. The supporting column 30 has a pair of fixing slots 313 at opposite ends of the half-sleeve shaft 319. Each stopper member 70 comprises a main body (not labeled) with a bulge 703 and a pair of fixing blocks 701 extending from the main body. A through hole 705 is defined therethrough. The frame 50 comprises a plurality of recesses 501 and defines a threaded hole 503 through in each recess 501. In assembly, ends of the stiff shaft 33 are inserted into through holes 705 of respective stopper members 70 and the fixing blocks 701 are engaged in the fixing slots 313. The bulge 703 of stopper member 70 is fittingly received in a corresponding recess 501 of a corresponding frame 50. The supporting columns 30 are fixed to the frames 50 by engagement of screws (not shown) in the threaded hole 503, 331.

The supporting column 30 of the present invention has the following advantage. The supporting column 30 employs a half-sleeve shaft 319 having a C-shaped cross section and a plurality of parallel wing panels 317, so a significant savings in material used is achieved over the convention supporting column, which reduces manufacturing cost.

It is to be understood, however, than even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the extent indicated by the broad general meaning of the terms in which the appended claims are expressed.

What is claimed is:

1. A supporting column for supporting substrates, comprising:
    a main body having a C-shaped cross section and defining an axial bore along an axis direction, and
    a stiff shaft being received in the axial bore,
    wherein the main body comprises a half-sleeve shaft and a plurality of parallel wing panels encircling portions of the half-sleeve shaft, and each wing panel includes a protrusion in a middle of the wing panel.

2. The supporting column as described in claim 1, wherein the wing panels are spaced apart from one another a predetermined distance and are formed perpendicular to the half-sleeve shaft.

3. The supporting column as described in claim 1, wherein a shape of the wing panels is round, approximately round, or tongue-shaped.

4. The supporting column as described in claim 1, wherein a size of the protrusion gradually decreases from the half-sleeve shaft to the edge of the wing panels.

5. The supporting column as described in claim 1, wherein the protrusion of each wing panel is shaped as a conicity or a hill.

6. The supporting column as described in claim 1, wherein the stiff shaft is made of metal.

7. The supporting column as described in claim 1, wherein the stiff shaft defines threaded holes in opposite ends thereof.

8. The supporting column as described in claim 1, wherein the half-sleeve shaft of the main body has holding portions, the holding portions extend along a circumference of the stiff shaft beyond half circumference.

9. The supporting column as described in claim 8, wherein the holding portions space apart each other in the axis direction.

10. A supporting column for supporting substrates, comprising:
    a main body having a C-shaped cross section and defining an axial bore along an axis direction, and
    a stiff shaft being received in the axial bore,
    wherein the main body comprises a half-sleeve shaft and a plurality of parallel wing panels encircling portions of the half-sleeve shaft, and each wing panel includes a strip-like protrusion extending upon an upper face thereof along a direction from a root portion of each wing panel to an outer edge thereof in a tapered and thinned manner.

* * * * *